United States Patent [19]

Mefford

[11] Patent Number: 4,908,526
[45] Date of Patent: Mar. 13, 1990

[54] PULSE GENERATOR OUTPUT VOLTAGE CALIBRATION CIRCUIT

[75] Inventor: Joseph P. Mefford, Glen Cove, N.Y.

[73] Assignee: Harris Corporation, Melbourne, Fla.

[21] Appl. No.: 202,786

[22] Filed: Jun. 3, 1988

[51] Int. Cl.⁴ .......................... H03K 5/08; H03K 5/12
[52] U.S. Cl. ................................. 307/263; 307/264; 307/546; 307/555; 307/562
[58] Field of Search ............... 307/263, 264, 546, 553, 307/555, 562

[56] References Cited

U.S. PATENT DOCUMENTS

| | | |
|---|---|---|
| 3,395,293 | 7/1968 | Perloff .................................. 307/263 |
| 3,849,670 | 11/1974 | Lourigan . |
| 3,881,145 | 4/1975 | Tanigaki . |
| 3,930,256 | 12/1975 | Amemiya ........................... 307/264 |
| 4,045,719 | 8/1977 | Salzer . |
| 4,047,050 | 9/1977 | Laurent . |
| 4,313,062 | 1/1982 | Wilber et al. . |
| 4,380,746 | 4/1983 | Sun et al. . |
| 4,383,185 | 5/1983 | Brewer . |
| 4,412,138 | 10/1983 | Becker ................................ 307/264 |
| 4,442,362 | 4/1984 | Rao . |
| 4,507,576 | 3/1985 | McCracken et al. ............... 307/263 |
| 4,614,878 | 9/1986 | Lauchner et al. . |
| 4,651,021 | 3/1987 | Hawkey . |
| 4,791,312 | 12/1988 | Weick ................................. 307/263 |

Primary Examiner—John Zazworsky
Attorney, Agent, or Firm—Scully, Scott, Murphy & Presser

[57] ABSTRACT

A calibration circuit for a pulse generator which produces pulse rise and pulse fall times by charging and discharging a capacitor at selected currents and clamps the pulse high voltage output and pulse low voltage output at selectable voltage levels. An output voltage error is developed by comparing each output voltage to a reference clamping voltage. The output voltage error is converted to digital form for storage and then reconverted back into a voltage where it effectively compensates the reference clamping voltage, thereby removing the error from the output voltage. The pulse generator output can be calibrated for any combination of currents and voltages and also for any amplification factor selected for the output amplifier.

6 Claims, 10 Drawing Sheets

PULSE GENERATOR OUTPUT VOLTAGE CALIBRATION CIRCUIT

BACKGROUND OF THE INVENTION

1. Field of the Invention

The present invention relates generally to a circuit for calibrating and correcting the pulse amplitude output of a pulse generator, and more particularly pertains to a calibration circuit for adjusting and correcting the output pulse high voltage level and low voltage level.

2. Discussion of the Prior Art

The calibration circuit of the present invention is associated with that part of a prior art pulse generator circuit which determines the output pulse high and low voltage levels, and the rise and fall times of the output pulse. In operation of such a pulse generator circuit, a logical "1" state of an input pulse causes a current switch to direct a leading edge current supplied by a leading edge current generator to charge a capacitor until a high voltage level is reached. When the high voltage level is reached, the leading edge current flows into a positive clamping circuit thereby clamping the high voltage level. When the state of the input pulse is a logical "0", the current switch directs the leading edge current to flow to ground such that it no longer affects the capacitor voltage. A trailing edge current supplied by a trailing edge current generator is then directed to flow to the capacitor causing it to charge in a negative direction until a low voltage level is reached. At that point, the trailing edge current is directed into a negative or low clamping circuit and the capacitor voltage is clamped to the low voltage level.

The high voltage and low voltage clamping circuits determine the accuracy of the pulse upper output voltage and the pulse lower output voltage The accuracy of the clamping circuits depends upon the characteristics of a pair of transistors therein being precisely matched so that when equal emitter currents flow through each, there will also be equal base voltages and equal collector voltages across each. The aformentioned matching requirements cause many practical problems. If the transistors are to switch at high speeds as required by a pulse generator of short pulses at high pulse repetition frequencies, then they generally are not available in matched pairs, but must be purchased in volume, and then characterized and matched by the equipment builder. This task is unattractive because of the substantial effort involved, and also because of the fact that many transistors will be left over because they cannot be matched over the large current range required. The present invention makes the transistor matching requirements much less stringent, and consequently increases the yield of transistor pairs and decreases the selection effort.

An output amplifier amplifies the clamped pulse output voltages and to amplify high frequency pulses, the amplifier must be capable of amplifying high frequencies and also all lower frequencies including DC. The DC requirement results in a contribution to the output voltage error which is the DC offset of the output amplifier. This offset normally varies with time and changes in the amplification factor itself. The present invention compensates for output amplifier errors as well as for clamping circuit errors as the two errors are cumulative.

SUMMARY OF THE INVENTION

Accordingly, it is a primary object of the present invention to provide a circuit for calibrating and correcting the pulse amplitude output of a pulse generator.

A further object of the subject invention is the provision of a calibration circuit as described which adjusts and corrects both the output pulse high voltage level and low voltage level.

An additional object of the present invention is to provide a calibration circuit for a pulse generator which compensates for errors in the pulse generator circuit, including errors in its output amplifier and errors in its clamping circuits.

Another object of the subject invention is to provide a calibration circuit which makes the transistor matching requirement in the clamping circuits of the pulse generator much less stringent, and consequently increases the yield of transistor pairs and decreases the selection effort.

In accordance with a preferred embodiment, the present invention provides a calibration circuit for a pulse generator which produces pulse rise and pulse fall times by charging and discharging a capacitor at selected currents and clamps the pulse high voltage and low voltage outputs at selected high and low voltage levels. In the high voltage output calibration circuit, the high voltage output of the pulse generator is compared with a high reference clamping voltage to develop a high voltage output error signal The high voltage output error signal is converted to a digital high voltage error signal for storage in a digital memory. The stored digital high voltage error signal is reconverted back into a high voltage error signal which is then combined with the high reference clamping voltage to compensate the high reference clamping voltage, thereby removing the error from the pulse high voltage output. In the low voltage calibration circuit, the low voltage output of the pulse generator is compared with a low reference clamping voltage to develop a low voltage output error signal The low voltage output error signal is converted to a digital low voltage error signal for storage in a digital memory. The stored digital low voltage error signal is reconverted back into a low voltage error signal which is then combined with the low reference clamping voltage to compensate the low reference clamping voltage, thereby removing the error from the pulse low voltage output.

The calibration circuit of the present invention is particularly designed for a pulse generator circuit wherein, in operation, a logical one state of an input pulse causes a current switch to direct a leading edge current supplied by a leading edge current generator to charge a capacitor until a pulse high voltage output level is reached. When the pulse high voltage output level is reached, the leading edge current is redirected to flow into a high clamping circuit, thereby clamping the pulse high voltage output level. When the state of the input pulse is a logical zero, the current switch directs the leading edge current to flow to ground such that it no longer affects the capacitor voltage. Moreover, a trailing edge current supplied by a trailing edge current generator is directed to flow to the capacitor causing it to charge in a negative direction until a pulse low voltage output level is reached. At that time the trailing edge current is redirected into a low clamping circuit, and the capacitor voltage is clamped to the pulse low voltage output level. The pulse generator also includes an output amplifier, and the calibration circuit effectively compensates for errors in the output amplifier and also for errors in the high clamping circuit and the low clamping circuit.

In greater particularity, the calibration circuit further includes a mode select switch for supplying a logical one to the pulse generator for calibrating the pulse generator at the output pulse high voltage level, and also for supplying a logical zero to the pulse generator for calibrating the pulse generator at the output pulse low voltage level. Moreover, a calibration load resistor is coupled to the output of the output amplifier, and a programmable resistor network is coupled to the calibration load resistor A high voltage difference calculator and a low voltage difference calculator are connected between the programmable resistor network and the converting means of respectively the high and low voltage calibration circuits. A high resistor voltage divider network and a low resistor voltage divider network are also connected to the reconverting means of respectively the high and low voltage calibration circuits. A second high voltage difference calculator is connected between the high resistor voltage divider network and the high clamp circuit, and a second low voltage difference calculator is connected between the low resistor voltage divider network and the low clamp circuit, thereby providing respectively the high and low voltage error signals.

BRIEF DESCRIPTION OF THE DRAWINGS

The foregoing objects and advantages of the present invention for a pulse generator output voltage calibration circuit may be more readily understood by one skilled in the art with reference being had to the following detailed description of a preferred embodiment thereof, taken in conjunction with the accompanying drawings wherein like elements are designated by identical reference numerals. throughout the several views, and in which.

DETAILED DESCRIPTION OF THE DRAWINGS

The calibration circuit of the present invention is associated with that part of a prior art pulse generator circuit which determines the output pulse high and low voltage levels, and the rise and fall times of the output pulse. This part of the pulse generator will be referred to hereinafter as a pulse shaper and output amplifier.

Figure 1:
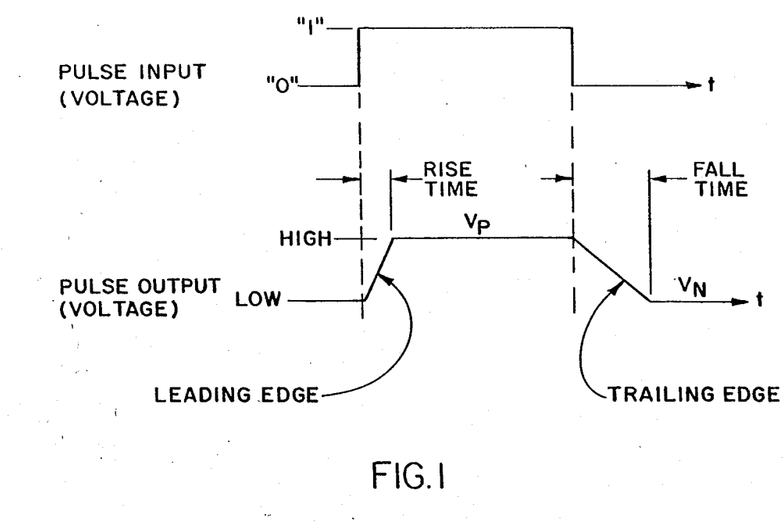
FIG. 1 illustrates two pulse waveforms useful in defining and explaining the present invention.

That part of a prior art pulse generator which precedes the pulse shaper provides pulse start and stop information, as shown by the pulse input at the top of FIG. 1. The relationship of this information to the generated output pulse, bottom of FIG. 1, is shown by FIG. 1. Up to the pulse shaper, the pulse format is in a standard logic format as illustrated by the top of FIG. 1. For high frequency operation, the logic format would most likely be Emitter Coupled Logic (ECL).

Figure 2:
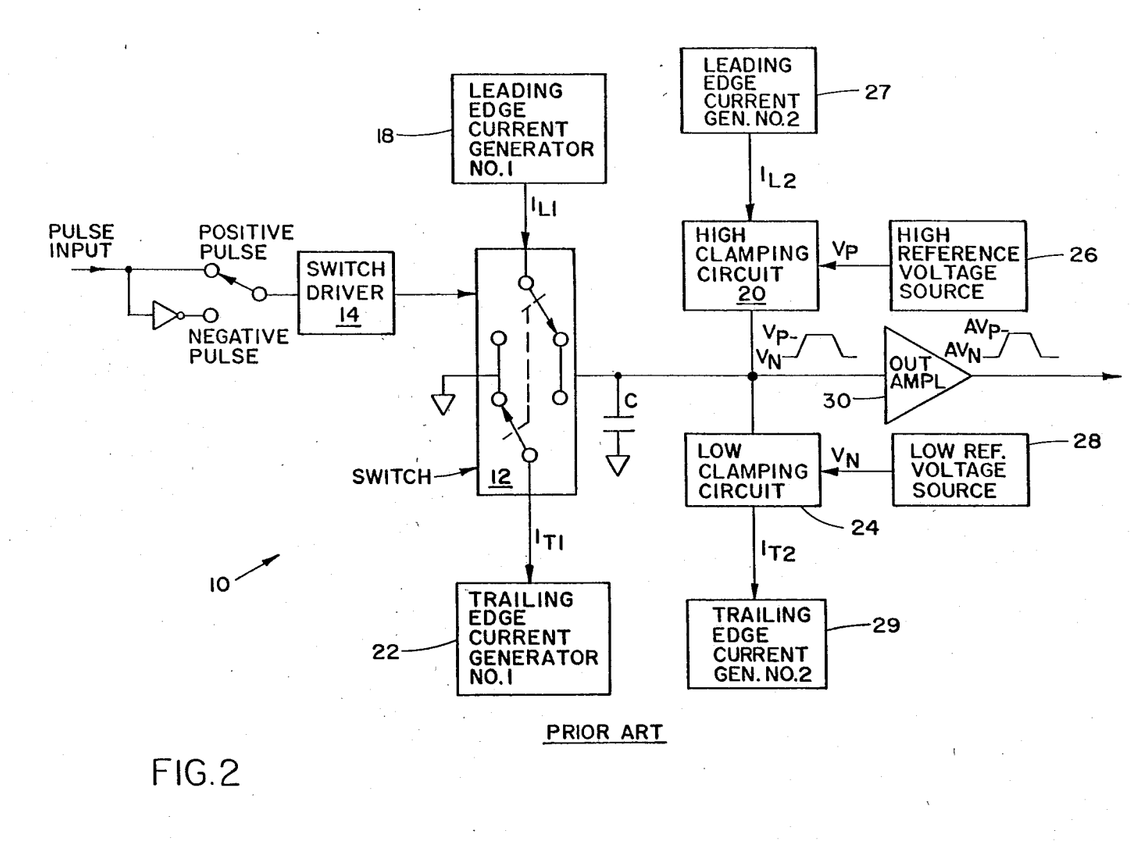
FIG. 2 is a block diagram of a prior art pulse generator circuit of the type the calibration circuit of the present invention is designed to calibrate.
Figure 3:
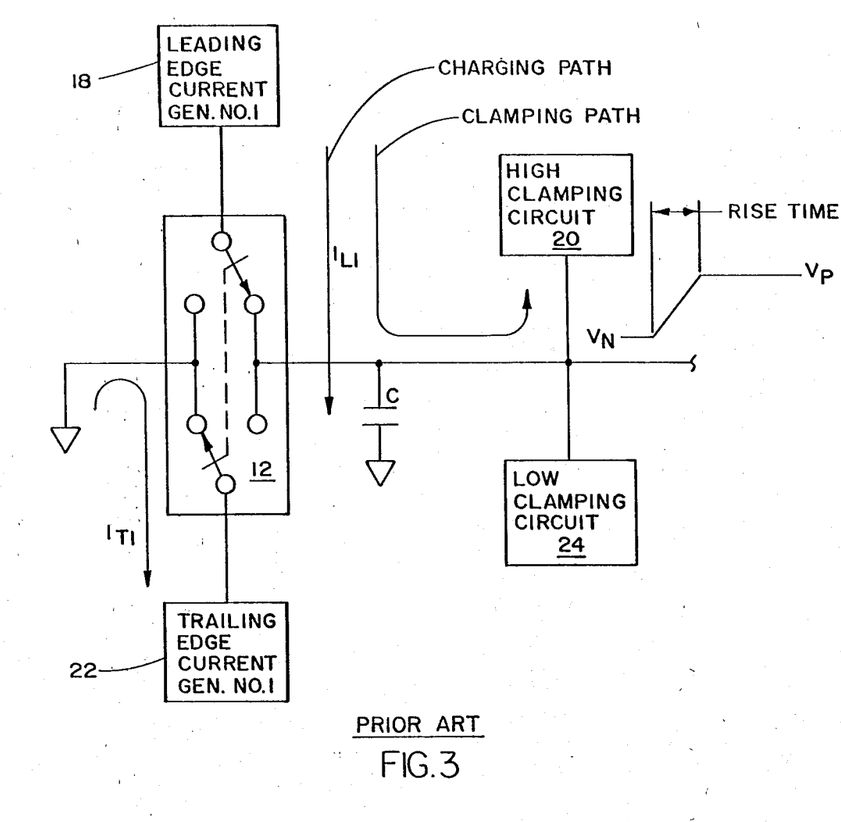
FIGS. 3 and 4 illustrate schematically two operational states of the pulse generator circuit of FIG. 2.
Figure 4:
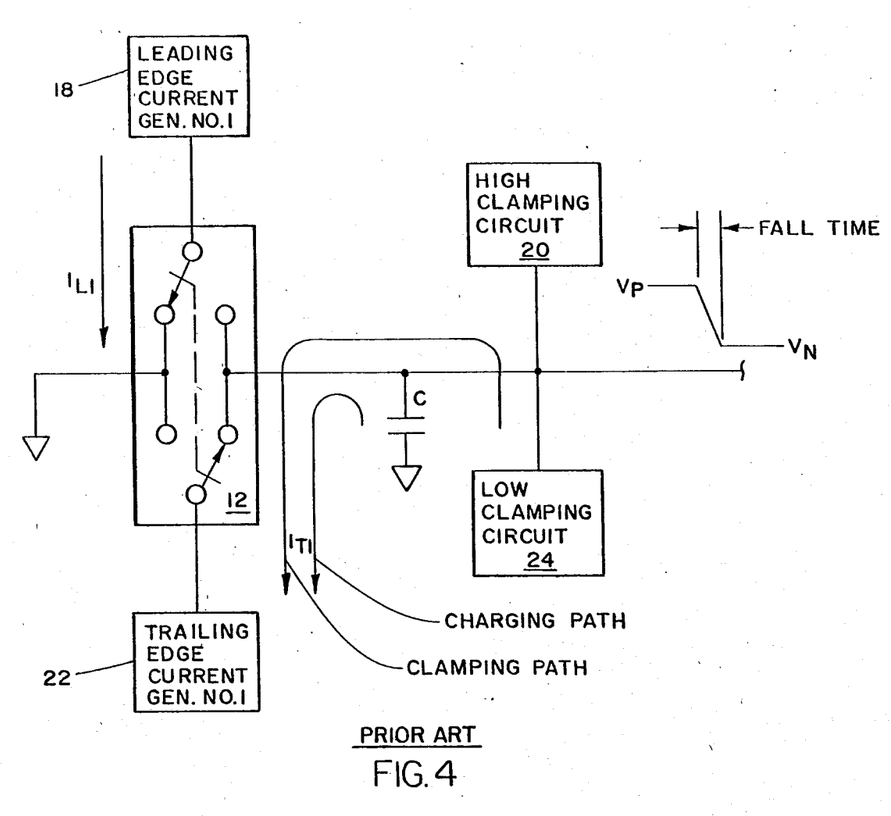

FIG. 2 is a block diagram of a prior art pulse generator 10 of the type the calibration circuit of the present invention is designed to calibrate, while FIGS. 3 and 4 illustrate the operation of the pulse generator circuit 10.

In FIGS. 2 through 5, a current switch 12 is shown as an electromechanical switch for purposes of illustrating the direction of current flow. However, an electromechanical switch would not be suitable to switch current fast enough for a practical pulse generator, and a practical embodiment thereof would use an electronic switch. Such an electronic switch is typically driven in operation by a switch driver circuit 14.

In operation, a logical "1" state of the input pulse, shown as a positive pulse in FIG. 1, causes the current switch 12 to assume the position of FIGS. 2 and 3. In this position a leading edge current $I_{L1}$ supplied by a leading edge current generator 18 charges a capacitor C until a voltage $V_P$ is reached. When voltage $V_P$ is reached, the leading edge current $I_{L1}$ then flows into a positive clamping circuit 20, as illustrated in FIG. 3, thereby clamping the voltage to $V_P$. In this arrangement, the rise time of the capacitor voltage pulse is a function of:

1. The voltage excursion from $V_N$ to $V_P$,
2. The value of capacitance C, and
3. The magnitude of $I_{L1}$.

Practical embodiments of the pulse generator generally have provision for operator control of the voltage rise time, accomplished for example by switching between various values of C or by controlling $I_{L1}$.

When the state of the input pulse is a logical "0", the current switch 12 assumes the position of FIG. 4. The leading edge current $I_{L1}$ then flows to ground and no longer affects the capacitor C voltage. A trailing edge current $I_{T1}$ supplied by a trailing edge current generator 22 is now directed to flow to the capacitor C, causing it to charge in a negative direction until a voltage $V_N$ is reached.

At that point, the trailing edge current $I_{T1}$ is directed into a negative or low clamping circuit 24 and the capacitor voltage is clamped to a value $V_N$. The pulse fall time factors follow the aforementioned pulse rise time factors, namely:

1. The voltage excursion from $V_P$ to $V_N$,
2. The value of capacitance C, and
3. The magnitude of $I_{T1}$.

Figure 6:
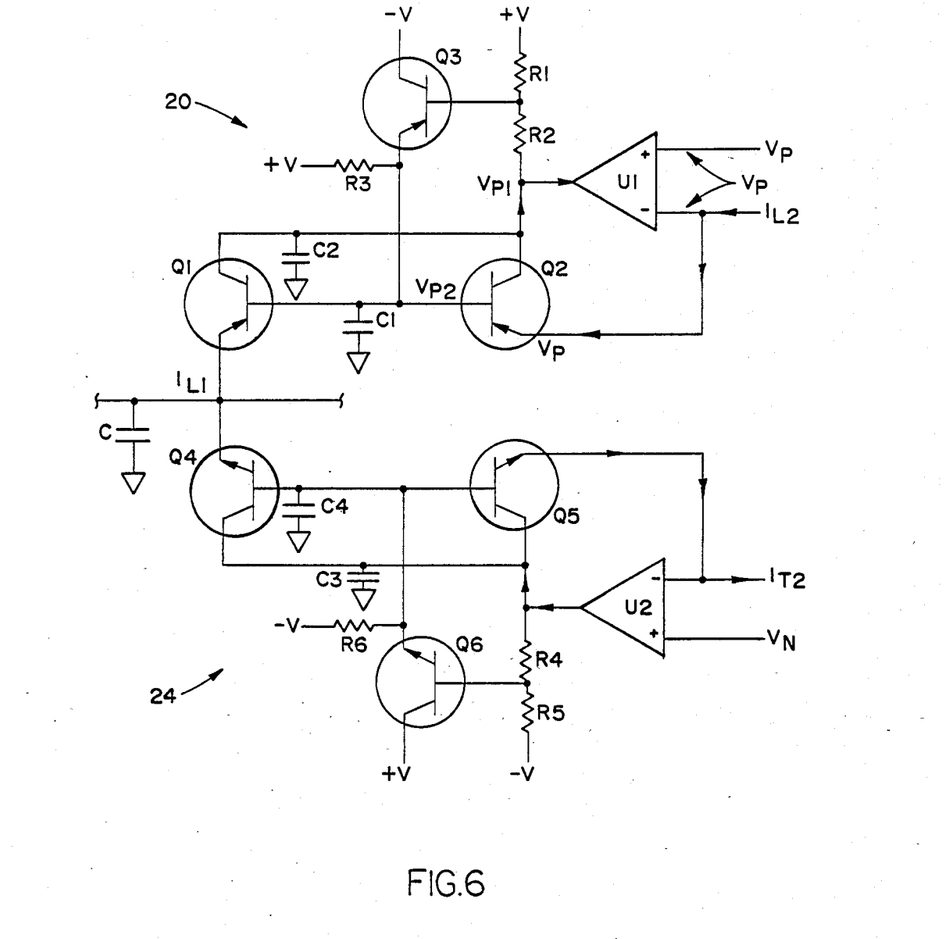
FIG. 6 is a schematic circuit diagram of the high and low clamping circuits of the pulse generator circuit.

The clamping circuits 20 and 24 determine the accuracy of the pulse upper output voltage $V_P$ and the pulse lower output voltage $V_N$ at the capacitor C, and the schematics for these clamping circuits are shown in FIG. 6. Referring thereto, a positive reference voltage $V_P$ supplied by a high reference voltage source 26 is introduced at a reference side of the high clamping circuit. A current $I_{L2}$, which is equal to $I_{L1}$, is supplied by a second leading edge current generator 27, FIGS. 2 and 6, and biases a transistor Q2. An operational Amplifier U1, transistor Q2, and the supporting circuitry establish voltages on the base and collector of transistor Q2 which are also are applied to a transistor Q1, which is a clamping transistor. When the capacitor voltage reaches the voltage $V_P$, the clamping transistor Q1 turns on, thereby clamping the capacitor voltage at $V_P$. However, the voltage is clamped at exactly $V_P$ only if the transistors Q1 and Q2 are precisely matched at collector currents equal to $I_{L2}$ (which equals $I_{L1}$). The characteristics of transistors Q1 and Q2 should be precisely matched so that when equal emitter currents flow through each, then there will also be equal base voltages and equal collector voltages across each.

The aforementioned matching requirements cause practical problems. If the transistors are to switch at high speeds as required by a pulse generator of short pulses at high pulse repetition frequencies, then they generally are not available in matched pairs, but must be purchased in volume, and then characterized and matched by the equipment builder. This task is unattractive because of the substantial effort involved, and also because of the fact that many transistors will be left over because they cannot be matched over the large current range required.

The present invention makes the transistor matching requirements much less stringent, and consequently increases the yield of transistor pairs and decreases the selection effort.

It should be understood that the clamping circuits of FIG. 6 are abbreviated for purposes of clarity, and that practical embodiments of the circuits require additional components for reasons other than clamping voltage accuracy.

An output amplifier 30, FIG. 2, amplifies the clamped pulse voltage by an operator controlled or computer controlled value A. In order to amplify high frequency pulses, the amplifier 30 must be capable of amplifying high frequencies and also all lower frequencies including DC. The DC requirement results in a contribution to the output voltage error which is the DC offset of the amplifier. This offset normally varies with time due to thermal transients in the components, the temperature of the immediate environment, aging of the components, and changes in the amplification factor itself. The amplification factor may be inaccurate by an amount A for any given gain setting A, thus making the actual gain $A+\Delta A$.

The present invention compensates for output amplifier errors as well as for clamping circuit errors as the two errors are cumulative.

The present invention provides an adjustment in sequence for the output pulse high voltage $V_P$ and the output pulse low voltage $V_N$. The adjusting (calibrating) procedure can be undertaken at any time when the output is not in use, and can be initiated by a human operator or by automatic test equipment, whichever is applicable.

Figure 5:
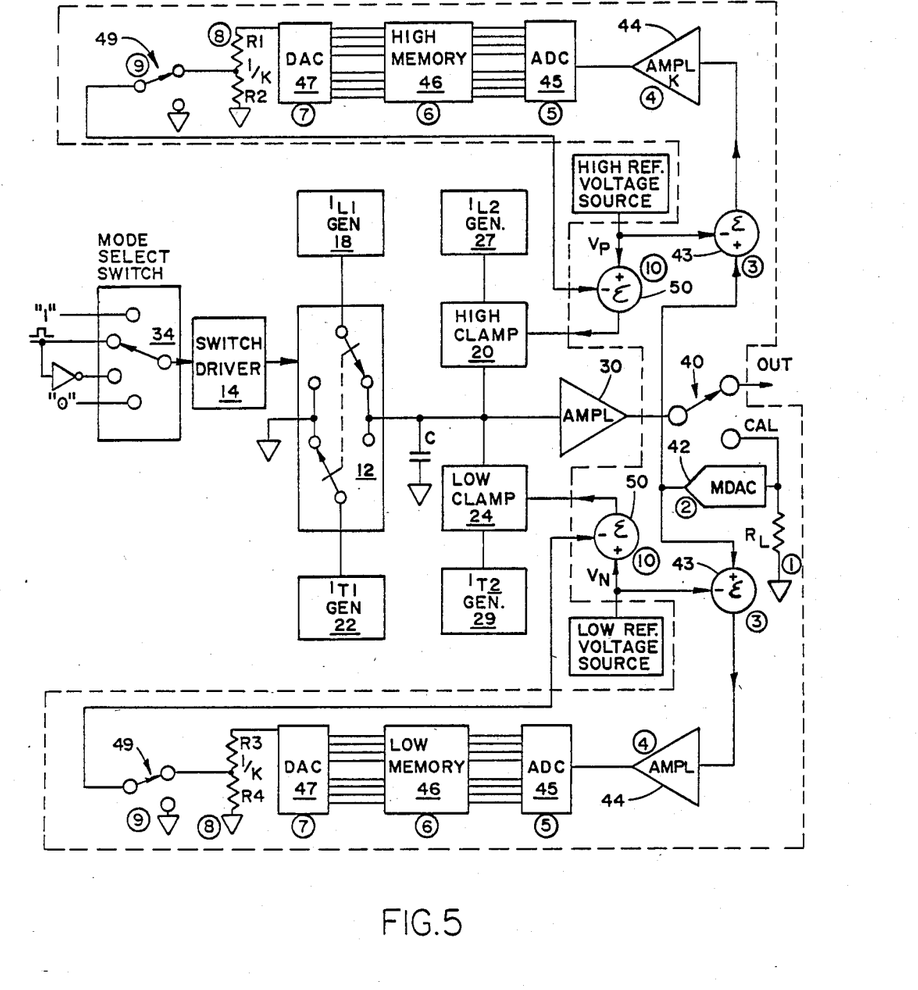
FIG. 5 is a block diagram of a pulse generator circuit similar to that of FIG. 2 having coupled thereto an exemplary embodiment of a calibration circuit constructed pursuant to the teachings of the present invention.

The calibration system comprises three parts, two of which are shown in FIG. 5:
1. A mode select switch 34;
2. A calibration control sequence; and
3. A correction voltage memory, two of which are required, one for the output pulse high voltage and one for the output pulse low voltage.

Figure 8:
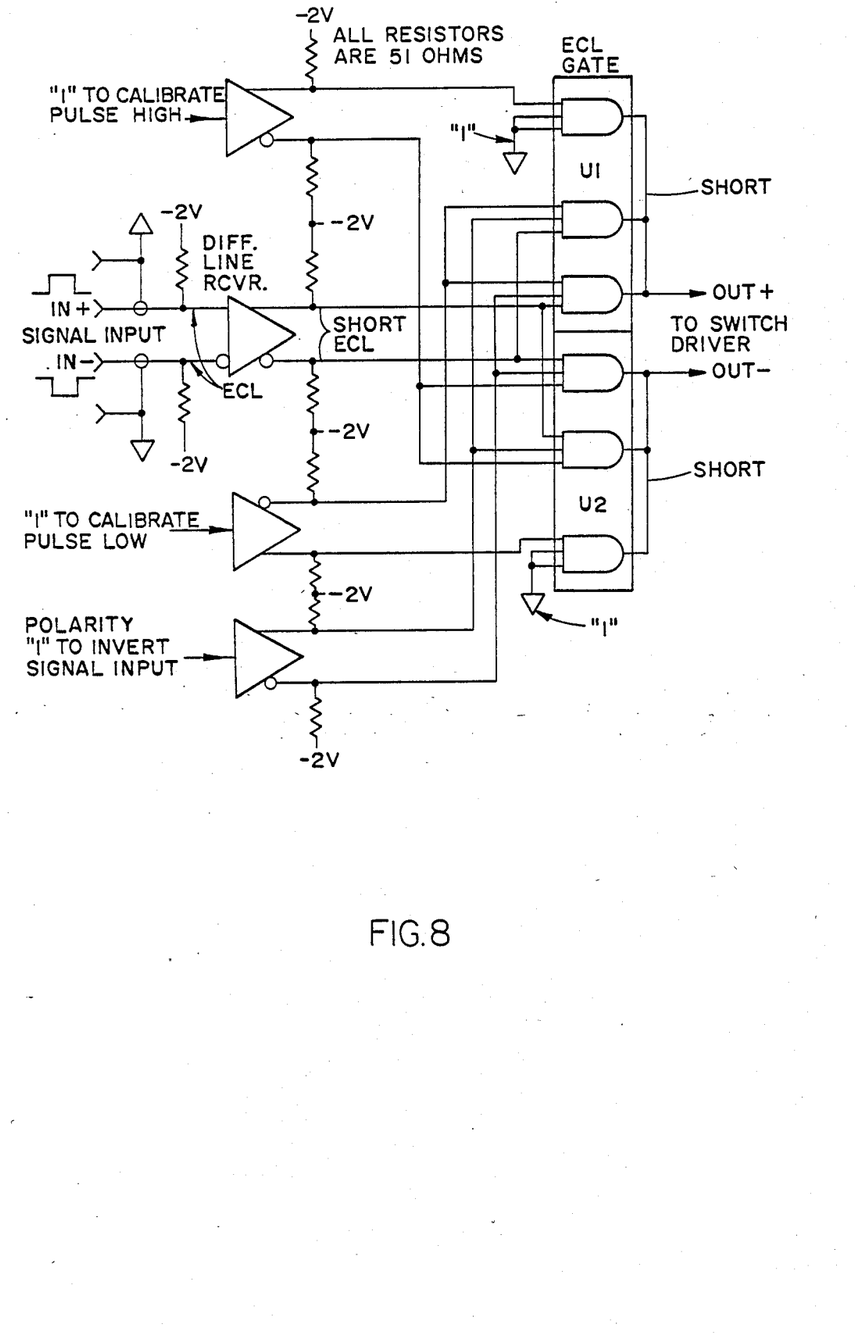
FIG. 8 illustrates an exemplary embodiment of the signal input line receiver and mode select logic circuit.

The mode select switch 34 is shown in FIG. 5 as a mechanical switch for purposes of illustration. However, since standard logic levels exist at this point, a more practical embodiment would be a combination of logic gates as shown in FIG. 8. The mode select switch 34 departs from the original function by supplying a logical "1" and "0" for the purpose of calibrating the pulse generator at the pulse high voltage and the pulse low voltage respectively, as described in greater detail hereinbelow.

Figure 7:
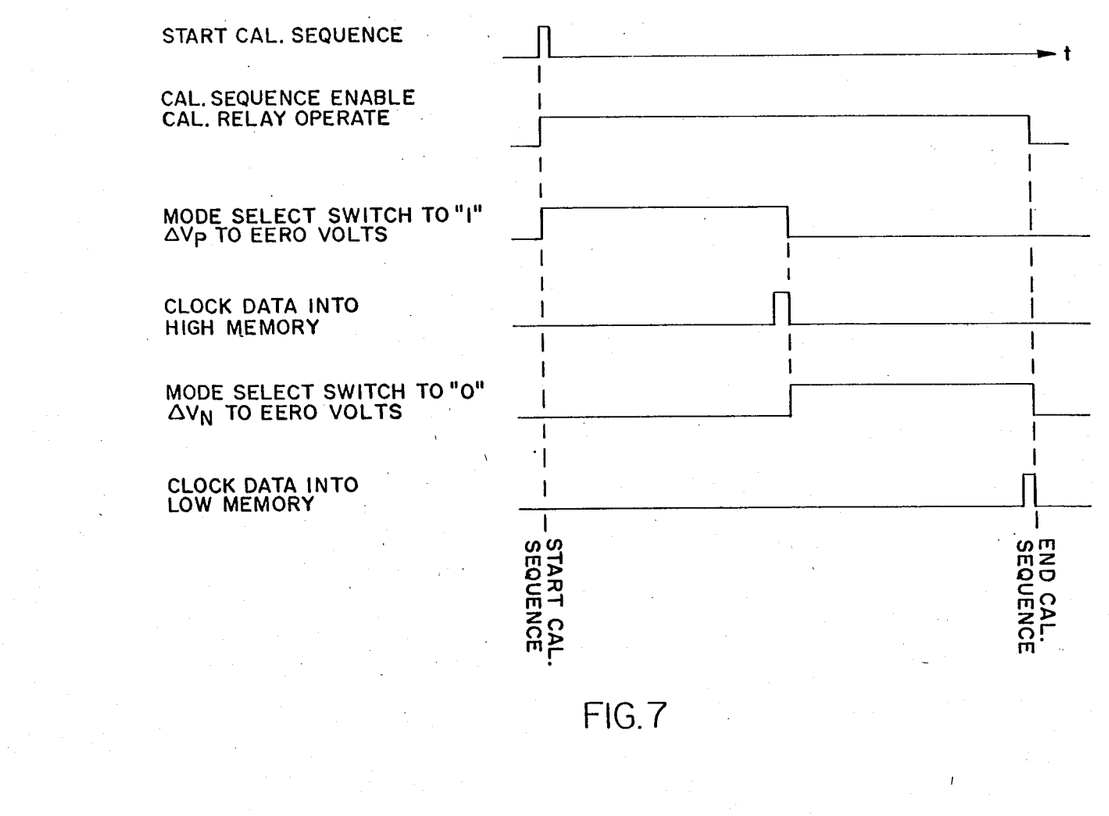
FIG. 7 illustrates waveforms of typical calibration control pulses and gates.

The calibration control sequence produces a sequence of logic level pulses and gates, FIG. 7, for purposes of controlling the required sequence of calibration steps. The sequencer can be provided by a combination of electronic timing/counter circuits-timers, logic gates and counter circuits cascaded, or can be any one of a number of suitable microprocessors programmed for this purpose. Referring to FIG. 7, the sequence of events is as follows:
1. Gate to enable the calibration sequence, and operate the calibrate/output relay 40 to the "cal" position for the duration of the calibration sequence.
2. Gate to operate the mode select switch 34 to the logical "1" (pule high) position for the duration of the pulse high sequence. Make the correction voltage for $V_P$ zero until new correction information is clocked into the high memory.
3. Pulse to clock new error information into the high memory after a suitable settling time.
4. Gate to make the correction voltage for $V_N$ zero until new correction information is clocked into the low memory.
5. Pulse to clock new error information into the low memory after a suitable settling time. End of calibration sequence.

The correction voltage memory is shown in block diagram form in FIG. 5. All of the correction voltage memory components are relatively slow devices in comparison with the pulse generator components. As such, highly accurate and stable memory components are commercially available as integrated circuits (ICs). Accordingly, for this reason it can be assumed that the calibration voltage memory contributes no error of its own.

Referring to the calibration circuit of FIG. 5, a calibration load resistor $R_L$ provides a load of the proper value during calibration. The output voltage level will vary with load value, and therefore a prescribed load value is required. A practical version of a programmable resistor network is a Multiplying Digital-to-Analog converter (MDAC) which is available in integrated circuit (IC) format. The gain A of the output amplifier is selected to be one or more. The gain of the MDAC 42 will be the reciprocal (1/A) and is programmable simultaneously with the output amplifier. A practical version of a voltage difference calculator 43 is an operational amplifier connected as a difference amplifier. Several high input impedance, low offset, IC format amplifiers are available for this purpose. The error voltage out of the voltage difference calculator 43 is a small voltage and is amplified by a voltage amplifier 44 having large gain K to provide an appropriate input for an Analog-to-Digital Converter (ADC) 45. This function can also be performed by the previous stage 43 by designing stage 43 for additional amplification. An Analog-to-Digital Converter (ADC) 45 converts the voltage output of amplifier 44 to digital format. An additional control pulse or gate may be necessary to initiate the conversion or enable the output logic levels depending on the type of ADC selected. Several are available in IC format. A memory 46 is utilized to store the error information after a suitable settling time, after which a clock pulse is utilized to clock the digital data into memory. A Digital-to-Analog Converter (DAC) 47 is utilized to convert the digital word in memory to recover the same voltage value as that into the ADC 45. A resistor divider network R$_1$ and R$_2$ is selected to have a gain of 1/K. A relay 49 is utilized and operated to cause the correction voltage at an error subtractor 50 to be zero while in the pulse high calibration mode. A gate is normally utilized to operate the relay 49. If the output error of resistor network R$_1$R$_2$ is in the positive direction, then the error subtractor 50 subtracts that value from reference voltage V$_P$, and vice versa. The error subtractor circuit 50 can be an operational amplifier circuit similar to 43.

The calibration circuit of the present invention should be without error since it operates at DC (zero frequency) and because precise circuitry is readily available. Also, for that same reason the reference voltages V$_P$ and V$_N$ and the currents I$_L$ and I$_T$ should be virtually without error.

In summary, any errors at the pulse generator output will be in the output voltage V$_O$ which will assume at any one time a pulse high value V$_P$ or a pulse low value V$_N$. Any errors in V$_O$ are caused by:
1. An error in V$_C$ caused by the clamp circuit (see FIG. 9), and/or
2. An error in the output amplifier caused by an error in the gain A and/or by the output offset.

Figure 9:
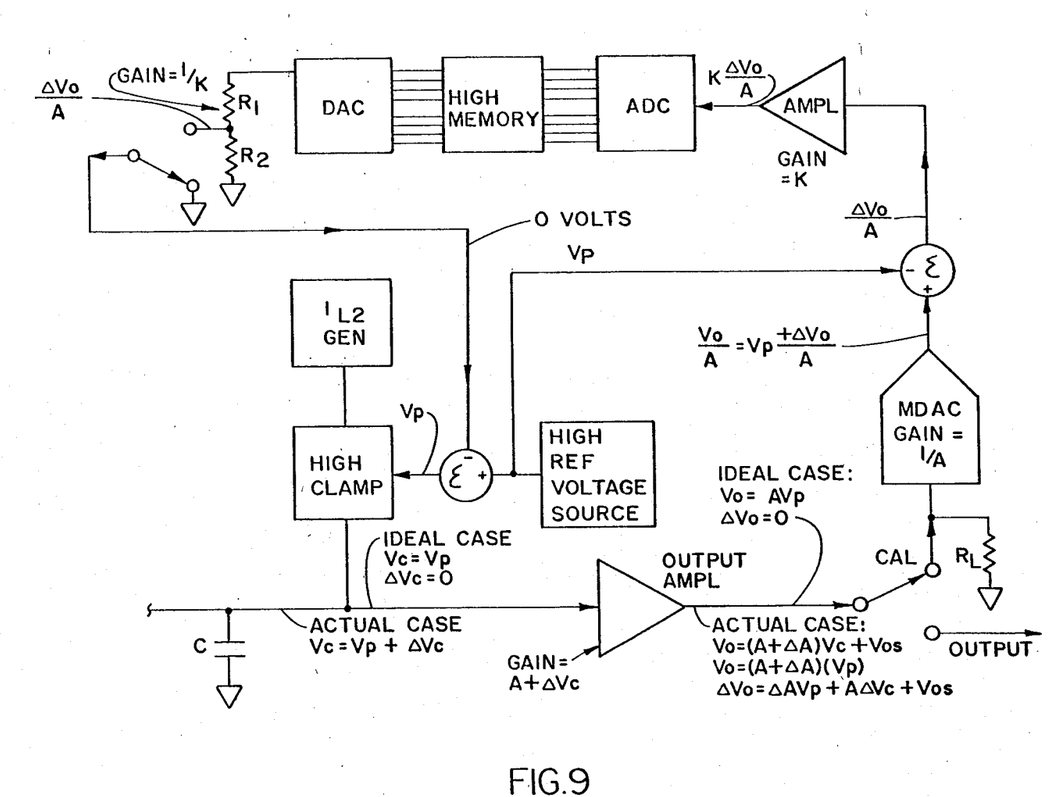
FIGS. 9 and 10 illustrate respectively the voltages at various points in the circuit of FIG. 5 during and after calibration.
Figure 10:
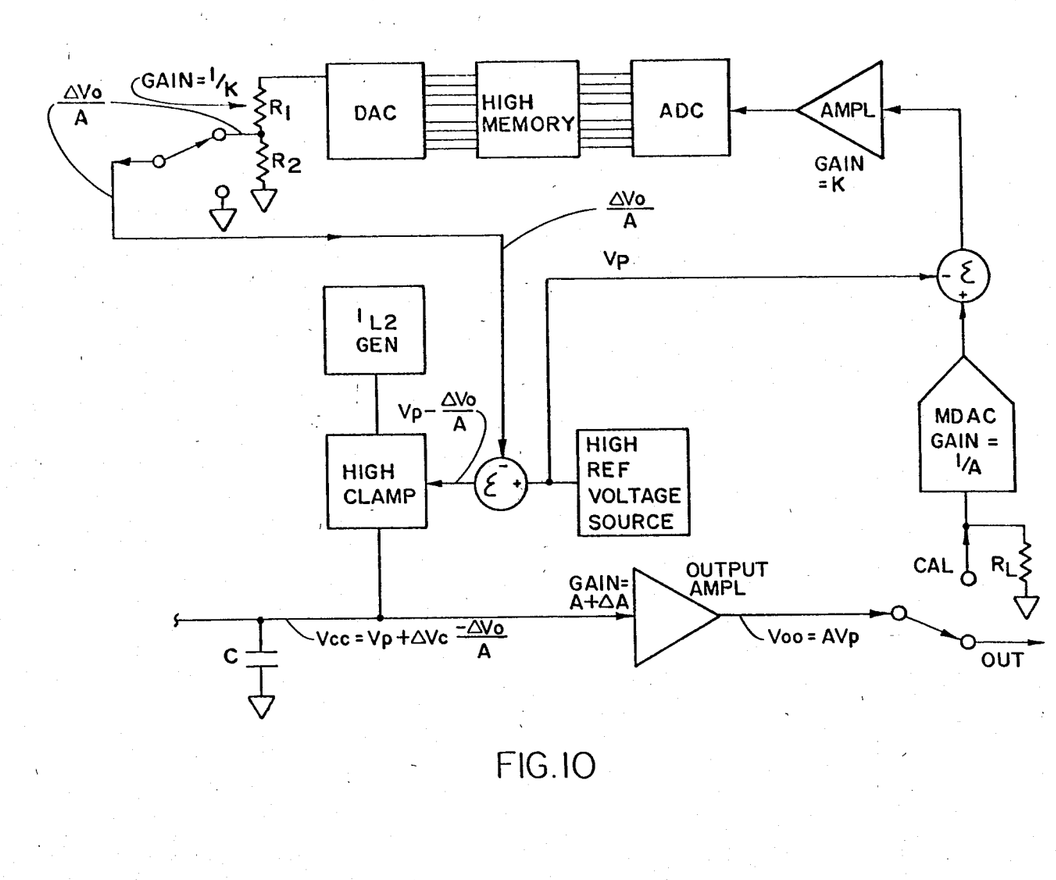

Referring to FIGS. 9 and 10, the output voltage can be expressed as $V_O = AV_P + \Delta V_O$, where AV$_P$ is the correct part and $\Delta V_O$ is the error caused by all of the aforementioned factors.

The voltage V$_C$ on the capacitor C is $V_C = V_P + \Delta V_C$, where V$_P$ is the desired portion of V$_C$ and $\Delta V_C$ is the error of the positive clamp. The output amplifier has again $A + \Delta A$ where $\Delta A$ is the gain error. In addition, the output amplifier has an output voltage offset V$_{OS}$ which contributes to the final error. The output, then, is $$V_O = (A + \Delta A) V_C + V_{OS}$$

$$V_O = (A + \Delta A)(V_P + \Delta V_C) + V_{OS}$$

$$V_O = AV_P + \Delta A V_P + A\Delta V_C + \Delta A \Delta V_C + V_{OS}$$

$$\Delta V_O = \Delta A V_P + A\Delta V_C + V_{OS}$$

The $\Delta V_O$ term is the undesired portion of the output and, as such, must be identified and nulled out.

The first step is to divide the output voltage by A with the MDAC 42 resulting in $$\frac{V_O}{A} = V_P + \frac{\Delta V_O}{A}$$

The subtractor circuit 43 subtracts the desired value V$_P$ which leaves the error $\Delta V_O/A$. This value is stored by the ADC/DAC combination and reappears later at the resistor divider R1 and R2.

The relay 49, which was placing zero volts into the voltage subtractor 50, is now switched and places the error voltage V$_O$/A into the voltage subtractor 50. The reference voltage V$_P$ is now corrected to $V_P - \Delta V_O/A$. The new V$_C$ will be $$V_{CC} = V_P - \frac{\Delta V_O}{A} + \Delta V_C$$

and the new output voltage will be $$V_{OO} = (A + \Delta A) V_{CC} + V_{OS}$$

$$V_{OO} = (A + \Delta A)\left(V_P - \frac{\Delta V_O}{A} + \Delta V_C\right) + V_{OS}$$

$$V_{OO} = AV_P - \Delta V_O + A\Delta V_C + \Delta A V_P - \frac{\Delta A \Delta V_O}{A} + \Delta A \Delta V_C + V_{OS}$$

$$V_{OO} = AV_P - \Delta V_O + (A\Delta V_C + \Delta A V_P + V_{OS})$$

$$V_{OO} = AV_P - \Delta V_O + \Delta V_O$$

$$V_{OO} = AV_P$$

where AV$_P$ is the desired output.

The same analysis applies to the pulse low correction voltage memory.

While several embodiments and variations of the calibration circuit are described in detail herein, it should be apparent that the disclosure and teachings of the present invention will suggest many alternative designs to those skilled in the art.

What is claimed is:

1. A calibration circuit for a pulse generator circuit which produces pulse rise and pulse fall times by charging and discharging a capacitor at selected currents and clamps the pulse high voltage output at a selected high voltage level, comprising:
   a. a pulse generator circuit including a capacitor, in which the generated pulse rise and pulse fall times are produced by charging and discharging said capacitor at selected currents, and the pulse high voltage output signal is clamped at a selected high voltage level;
   b. means for comparing the high voltage output of the pulse generator to a high reference clamping voltage to develop an analog high voltage output error signal;
   c. means for converting the analog high voltage output error signal to a digital high voltage error signal for storage;
   d. a digital memory for storing the digital high voltage error signal;
   e. means for reconverting the stored digital high voltage error signal into a high voltage analog error signal; and
   f. means for recombining the high voltage analog error signal with the high reference clamping voltage to compensate the high reference clamping voltage, thereby removing the error from the pulse high voltage output.

2. A calibration circuit as claimed in claim 1 wherein said pulse generator circuit also clamps the pulse low voltage output at a selected low voltage level, and further including a calibration circuit for the output pulse low voltage level, comprising
   a. means for comparing the low voltage output of the pulse generator to a low reference clamping voltage to develop an analog low voltage output error signal;
   b. means for converting the analog low voltage output error signal to a digital low error signal for storage;
   c. a digital memory for storing the digital low voltage error signal;

d. means for reconverting the stored digital low voltage error signal into a low voltage analog error signal; and e. means for combining the low voltage analog error signal with the low reference clamping voltage to compensate the low reference clamping voltage, thereby removing the error from the pulse low voltage output.

3. A calibration circuit as claimed in claim 2, wherein the pulse generator circuit includes a current switch, and during operation of the pulse generator circuit, a logical one state of an input pulse causes the current switch to direct a leading edge current supplied by a leading edge current generator to charge the capacitor until the pulse high voltage output level is reached, and when the pulse high voltage output level is reached, the leading edge current flows into a high clamping circuit thereby clamping the pulse high voltage output level, and when the state of the input pulse is a logical zero, the current switch directs the leading edge current to flow to ground such that it no longer affects the capacitor voltage, and a trailing edge current supplied by a trailing edge current generator is then directed to flow to the capacitor causing it to charge in a negative direction until the pulse low voltage output level is reached, at which the trailing edge current is directed into a low clamping circuit and the capacitor voltage is clamped to the pulse low voltage output level.

4. A calibration circuit as claimed in claim 3, wherein the pulse generator circuit includes an output amplifier, and the calibration circuit compensates for errors in the output amplifier and errors in the high clamping circuit and the low clamping circuit.

5. A calibration circuit as claimed in claim 4, further including a mode select switch for supplying a logical one to the pulse generator circuit for calibrating the pulse generator circuit at the output pulse high voltage level, and for supplying a logical zero to the pulse generator circuit for calibrating the pulse generator circuit at the output pulse low voltage level.

6. A calibration circuit as claimed in claim 5, further comprising a calibration load resistor coupled to the output of said output amplifier, a programmable resistor network coupled to said calibration load resistor, a high voltage difference calculator and a low voltage difference calculator coupled between said programmable resistor network and the converting means of respectively the high and low voltage calibration circuits, a high resistor voltage divider network and a low resistor voltage divider network coupled to the reconverting means of respectively the high and low voltage calibration circuits, and a second high voltage difference calculator and a second low voltage difference calculator coupled between respectively said high resistor voltage divider network and said high clamp circuit, and said low resistor voltage divider network and said low clamp circuit, to provide respectively said high and low voltage error signals.

* * * * *